United States Patent [19]

Santoru et al.

[11] Patent Number: 5,523,651

[45] Date of Patent: Jun. 4, 1996

[54] PLASMA WAVE TUBE AMPLIFIER/PRIMED OSCILLATOR

[75] Inventors: Joseph Santoru, Agoura Hills; Jennifer M. Butler, Pacific Palisades, both of Calif.

[73] Assignee: Hughes Aircraft Company, Los Angeles, Calif.

[21] Appl. No.: 259,650

[22] Filed: Jun. 14, 1994

[51] Int. Cl.$^6$ .................................................. H03F 3/54
[52] U.S. Cl. ........................................ 315/39; 330/41
[58] Field of Search ................................ 315/39; 330/41

[56] References Cited

U.S. PATENT DOCUMENTS

| | | | |
|---|---|---|---|
| 2,869,020 | 1/1959 | Sensiper | 315/3.5 |
| 3,087,089 | 4/1963 | Niclas | 315/3.5 X |
| 3,099,768 | 7/1963 | Anderson | 315/5.39 |
| 3,111,604 | 11/1963 | Agdur | 330/41 |
| 3,270,244 | 8/1966 | Ayaki | 315/39 |
| 3,317,784 | 5/1967 | Ferrori | 315/39 |
| 3,363,138 | 1/1968 | Gruber et al. | 315/39 |
| 3,378,723 | 4/1968 | Napoli et al. | 315/39 |
| 3,432,721 | 3/1969 | Naydon et al. | 315/39 |
| 3,432,722 | 3/1969 | Naydon et al. | 315/39 |
| 4,912,367 | 3/1990 | Schumacher et al. | 315/3.5 |
| 4,916,361 | 4/1990 | Schumacher et al. | 315/111.21 |
| 4,978,889 | 12/1990 | Schumacher | 315/111.21 |

OTHER PUBLICATIONS

Santoru, Joseph, et al., "Microwave/millimeter–wave generation in a counterstreaming–beam–plasma system", *Journal of Applied Physics*, 74 (5), Sep. 1993, pp. 3057–3060.

*Primary Examiner*—Benny T. Lee
*Attorney, Agent, or Firm*—V. D. Duraiswamy; W. K. Denson-Low

[57] ABSTRACT

Plasma wave tubes are disclosed having waveguide injection systems configured for injection of an RF signal to prebunch the electron beam of the tube and thereby control the frequency of an RF output signal. Preferred embodiments of the injection system include a plurality of rectangular waveguides arranged radially about a cylindrical waveguide member and joined to it for communication with its interior. Plasma wave tubes (140) are also disclosed that utilize the injection system as a collector (44C) to couple an RF output signal from the tube.

10 Claims, 5 Drawing Sheets

PLASMA WAVE TUBE AMPLIFIER/PRIMED OSCILLATOR

BACKGROUND OF THE INVENTION

1. Field of the Invention

The present invention relates generally to plasma wave tubes.

2. Description of the Related Art

Plasma wave tubes typically inject high-power electron beams into a waveguide filled with an ionizable gas to first ionize the gas into a plasma, and then generate electron plasma waves (EPWs) in that plasma. If the electron beam power is sufficiently high, the EPWs interact to generate electromagnetic energy which may be coupled out of the tube as an RF signal. Plasma wave tubes generally do not require externally applied magnetic fields for control and transport of the electron beam because the beam space charge is canceled by the generated plasma.

An exemplary plasma wave tube is described in U.S. Pat. No. 4,916,361 assigned to Hughes Aircraft Company, the assignee of the present invention. The structure disclosed in that patent injected two opposed electron beams into an ionizable gas to create the interacting EPWs.

Another exemplary plasma wave tube is described in U.S. Pat. No. 4,912,367 which is also assigned to Hughes Aircraft Company. This patent disclosed the injection of a single high-current electron beam into a smooth cylindrical waveguide to modify the plasma density in a periodic fashion which, in turn, produced backscattered plasma waves. The result, in effect, was a pair of counterpropagating plasma waves which coupled nonlinearly within the plasma to generate electromagnetic radiation.

A theory directed to the signal generation processes of plasma wave tubes that use counterpropagating electron beams was described in Santoru, Joseph, et al., "Microwave/millimeter-wave generation in a counterstreaming-beam-plasma system", *Journal of Applied Physics*, 74 (5), September, 1993, pp. 3057–3060.

Many of the plasma wave tubes described in the patents referred to above generally operated as free running oscillators whose output frequency was typically adjusted indirectly by changing the plasma density and, hence, the plasma frequency. An amplifier embodiment was also described in U.S. Pat. No. 4,916,361 in which a coherent microwave input signal was directed to intersect the opposed electron beams in an orthogonal relationship to provide a phase locked output.

Prebunching of the electron beam can provide a more direct control of the EPW spectrum and, hence, the output radiation frequency and bandwidth. However, structures that enable such prebunching in high-current, high-voltage electron beams in plasma wave tubes have proven to be difficult to realize.

SUMMARY OF THE INVENTION

The present invention is directed to plasma wave tube stuctures that facilitate prebunching of injected electron beams by use of an RF reference signal injected into the plasma to generate preferred EPWs and, thereby, control the frequency of an RF output signal.

Structures in accordance with the invention are characterized by an electron gun configured to generate an electron beam, a waveguide member configured to contain an ionizable gas and arranged to receive the electron beam for ionization of the gas to a plasma and generation in the plasma of electron plasma waves, and a waveguide injection system joined to the waveguide member to inject therein an RF input reference signal for prebunching of the electron beam to enhance the excitation of a desired set of electron plasma waves. The waveguide member has an exit end for delivery of an RF output signal developed by interaction of the desired set of electron plasma waves. Preferred embodiments include both single and dual electron beam structures.

In a preferred embodiment, the waveguide member is defined about a longitudinal axis and the injection system includes a plurality of first waveguides oriented radially with that axis and joined to the waveguide member to communicate with its interior. The first waveguides are spaced substantially equally about the circumference of the waveguide member, are rectangular in cross section, and their E-planes are arranged substantially parallel with the axis. The injection system includes a second waveguide arranged to communicate with each of the first waveguides, the second waveguide defining a port for reception of the RF input signal.

The preferred embodiment of the waveguide injection system is especially suited for coupling between TE10 electromagnetic modes in the injection system and TM01 electromagnetic modes in the waveguide member.

The novel features of the invention are set forth with particularity in the appended claims. The invention will be best understood from the following description when read in conjunction with the accompanying drawings.

DESCRIPTION OF THE PREFERRED EMBODIMENTS

Figure 1:
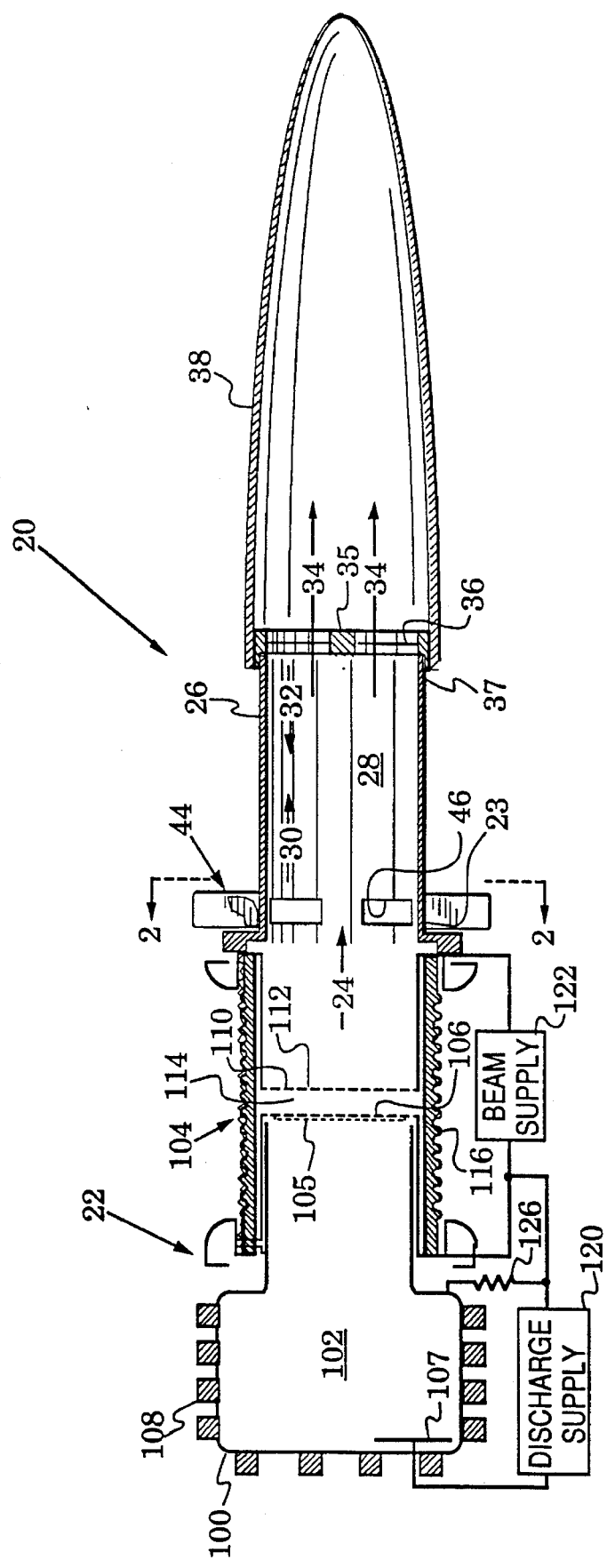
FIG. 1 is a sectional diagram of a preferred plasma wave tube embodiment having an RF injection system for prebunching of electron plasma waves; for clarity of illustration, FIG. 1 does not include the lower portion of the injection system which is fully shown in FIG. 2.

In accordance with the present invention, a preferred microwave plasma wave tube embodiment 20 is shown in FIG. 1. The plasma wave tube 20 has an electron gun 22 that injects a high-current-density beam 24 into the entrance end 23 of a cylindrical waveguide 26 that is filled with a low pressure ionizable gas 28. The electron beam 24 first ionizes the background gas 28 to create a plasma, and then interacts with the plasma to nonlinearly generate forward and backscattered electrostatic plasma waves (EPWs) 30, 32 within the waveguide 26. The power contained in the oscillating fields of the EPWs is coupled to an electromagnetic mode of the waveguide 26 at a frequency of 2 $\omega_{pe}$ where $\omega_{pe}$ is the plasma frequency. This electromagnetic mode is radiated from the waveguide 26 as an output RF signal 34.

A water cooled collector 35 is positioned axially in the end of the waveguide 26 by a plurality of thin struts 36 that extend radially inward from the waveguide 26. The collector 35 receives the spent electron beam 24 which travels along the axis of the waveguide 26. The typical electromagnetic mode created within the circular waveguide 26 is the TM01 mode which has an axial power null. Thus the majority of the RF power 34 is radiated around the collector 35 and out through the exit end 38 of the waveguide 26. An RF transparent radome 37 is sealed to the waveguide end 37 to maintain pressure of the background gas 28.

Since the plasma frequency $\omega_{pe}$ is determined by the plasma density and the plasma is produced by beam ionization, the RF properties of the plasma wave tube 20 are primarily controlled through the voltage and current of the electron beam 24, the pressure of the background gas 28, and the gas used, e.g., hydrogen, helium. Injection of the high-power electron beam 24 creates density inhomogeneities and density gradients in the plasma. These density variations typically increase the frequency bandwidth of the EPW spectrum, and hence, a widening of the bandwidth of the radiated RF signal 34 which is undesirable in many applications.

In accordance with a feature of the present invention, preferred EPW modes are selected by injection of an RF reference signal through a waveguide injection system 44 to prebunch the electron beam 24. Interaction of the bunched electron beam 24 with the plasma in the waveguide 26 suppresses the excitation of undesired EPWs and enhances the excitation of a preferred EPW. This results in a desirable reduction in the bandwidth of the radiated signal 34. The injected RF signal enters the front end of the waveguide 26 through apertures 46 that are formed by the junction of the injection system 44 with the waveguide 26.

Figure 3A:
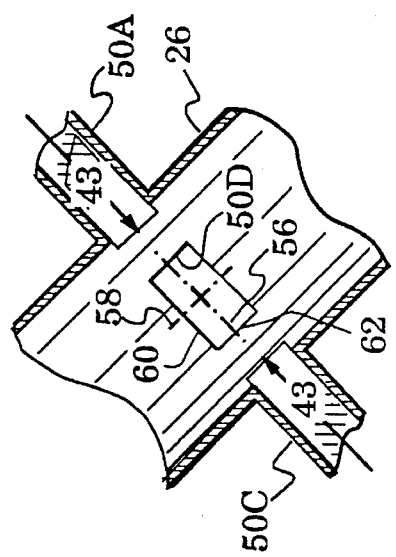
FIG. 3A is a view along the plane 3A—3A of FIG. 2.
Figure 2:
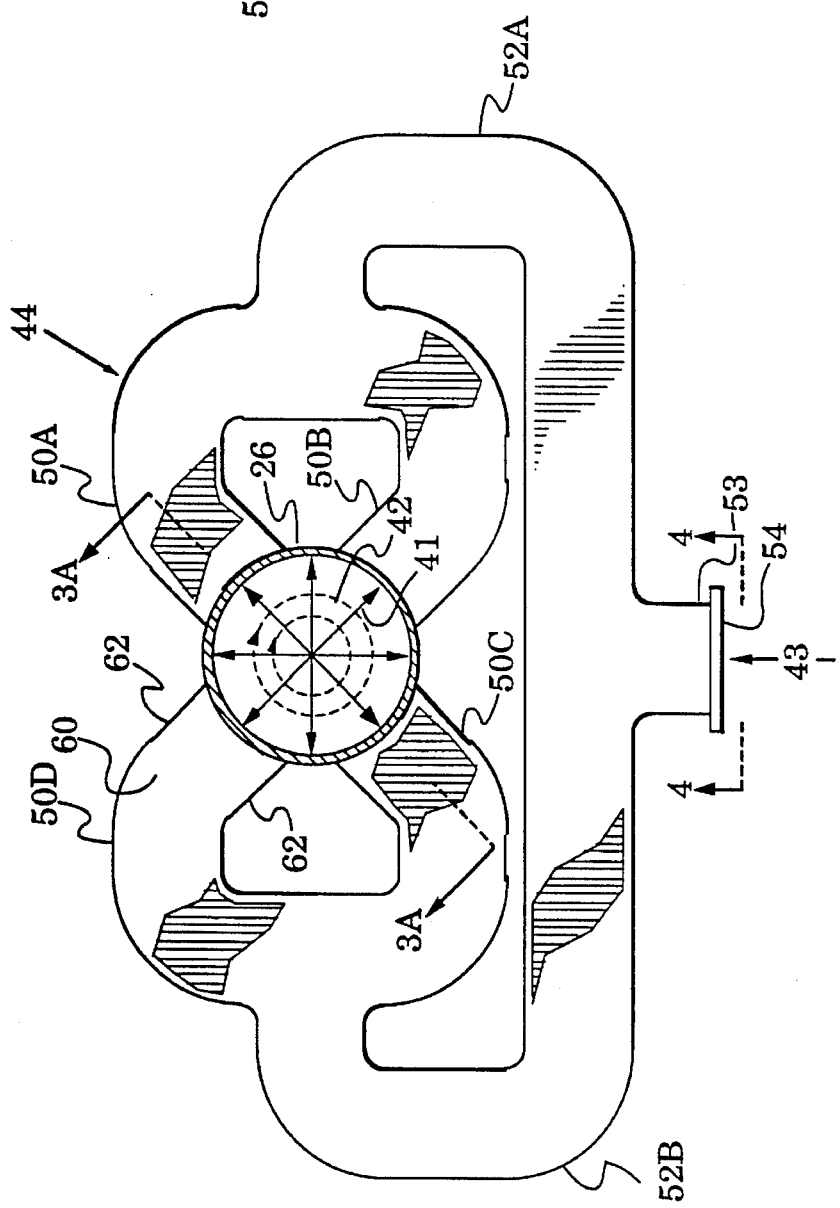
FIG. 2 is a view along the plane 2—2 of FIG. 1 illustrating a side view of the RF injection system.

Attention is first directed to the details of the waveguide injection system 44 as fully shown in FIGS. 2 and 3A. FIG. 2 is a sectional view of the system 44 along the plane 2—2 of FIG. 1 while FIG. 3A is a sectional view along the plane 3A—3A of FIG. 2 (for clarity of illustration, the lower portion of the injection system 44 is omitted in FIG. 1). The injection system is directed to the excitation of electromagnetic modes within the cylindrical waveguide 26. FIG. 2 schematically illustrates an exemplary mode in the form of a TM01 mode indicated by its radial electric field lines 41 and its circular transverse magnetic field lines 42. To successfully initiate bunching of the electron beam, energy injected into the waveguide 26 should preferably support the mode field lines 41, 42.

In FIGS. 2 and 3A, it is seen that four rectangular waveguides 50A, 50B, 50C and 50D are radially joined with the circular waveguide 26. The waveguides 50A and 50B join to form a waveguide 52A and the waveguides 50C and 50D similarly join to form a waveguide 52B. Finally, the waveguides 52A and 52B join to form a single waveguide 53 that defines an input port 54 for reception of the injected RF signal 43. The waveguide injection system 44 is also sealed to prevent loss of gas pressure, e.g., with waveguide windows at its junction with the waveguide 26.

The wide and narrow sides of rectangular waveguides are respectively aligned with what is typically referred to as the H-plane and the E-plane of the waveguide. For example, FIG. 3A indicates the H-plane and E-plane of the waveguide 50D respectively with broken lines 56 and 58. The H-plane 56 is parallel with the waveguide's broad sides 60 (shown in FIGS. 2 and 3A) while the E-plane 58 is parallel with the waveguide's narrow sides 62 (shown in FIGS. 2 and 3A).

Using the H-plane and E-plane descriptions of rectangular waveguides, these figures illustrate that the waveguides 50A–50D are radially joined with the circular waveguide 26 and their E-planes are aligned to be parallel with the axis of the waveguide 26. The waveguides 52A, 52B and 53 are arranged to have their H-planes and E-planes aligned respectively with the H-planes and E-planes of the waveguides 50.

Figure 4:
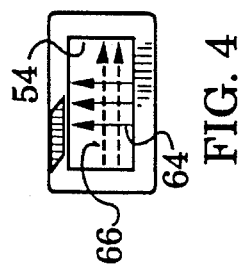
FIG. 4 is a view along the plane 4—4 of FIG. 2.

FIG. 4 is an enlarged view along the plane 4—4 of FIG. 2 illustrating the waveguide port 54. The injection system 44 can receive electromagnetic modes and insert them into the waveguide 26 to excite modes that will propagate in that waveguide. For example, to excite the exemplary TM01 mode shown in the waveguide 26 in FIG. 2, a TE10 mode signal 43 can be inserted into the port 54. The TE10 mode is schematically indicated in FIG. 4 by vertical electric field lines 64 and horizontal magnetic field lines 66.

The horizontal magnetic field lines 66 (see FIG. 4) remain aligned with the H-plane of the system 44 and are thus aligned with the transverse magnetic field lines 42 of the waveguide 26 as the electromagnetic energy is injected into that waveguide. In a similar manner, the electric field lines 64 (see FIG. 4) of the RF signal 43 are parallel with the E-plane 60 of the system 44 so that they are aligned with the radial electric field lines 41 of the waveguide 26.

The RF reference signal 43 is launched into the port 54 from where it splits along waveguides 52A, 52B and again splits along waveguides 50A–50D. From each of the waveguides 50A–50D, the signal 43 is inserted into the circular waveguide 26 as shown, for example, in the waveguides 50A, 50C of FIG. 3A.

The rectangular waveguides 50A–50D are preferably dimensioned so that their impedance matches that of the circular waveguide 26. Various configuration modifications of the waveguides, in accordance with designs well known in the art, may also be employed to obtain this matched impedance, e.g., the sections 50A–50D may be stepped in cross-sectional area as they approach the waveguide 26.

Figure 3B:
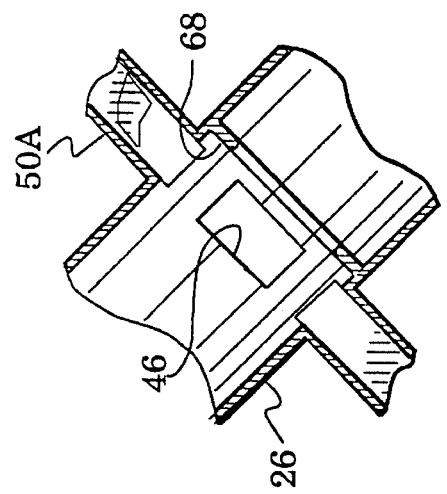
FIG. 3B is a view similar to FIG. 3A showing another RF injection system embodiment.

RF signals moving axially along the waveguide 26 to excite selected EPWs may be unduly perturbed by reflections from the entrance apertures 46 of the waveguides 50A–50D. Accordingly, a structure is shown in FIG. 3B that facilitates control over these reflections. FIG. 3B is similar to FIG. 3A with like elements indicated by like reference numbers. In particular, a reduced diameter annular ring 68 extends radially inward from the inner surface of the waveguide 26. The ring 68 is spaced from the rectangular waveguide apertures 46 sufficiently, e.g., an integral number of half-wavelengths, so that reflections from the ring 68 are in phase with the energy exiting the apertures 46. That is, energy that travels from the aperture 46 to the ring 68 and back will be phase shifted by integral wavelengths and is, therefore, in phase with energy exiting the aperture.

In contrast, energy traveling down the waveguide 26 and reflected from the apertures 46 is initially phase shifted 180° by that reflection. Portions of this reflected energy pass on to be reflected from the ring 68. Because of the integral wavelength travel, this energy portion is now out of phase with the other portions of the energy that were reflected from the aperture 46 and, hence, tend to cancel those portions. The amount of energy reflected from the ring 68 is controlled by the ratio between its inner diameter and that of the waveguide 26. Proper design, therefore, of the spacing of the ring 68 and its diameter can substantially control undesired reflections from the apertures 46.

A similar RF injection system is used in copending application Ser. No. 08/194,999, filed Feb. 7, 1994 by Jennifer M. Butler and Robert L. Eisenhart and assigned to Hughes Aircraft Company, the assignee of the present invention. The copending application is directed to microwave plasma-assisted tubes in which an electron beam is injected into a gas-filled slow-wave structure, e.g., a rippled-wall waveguide. The slow-wave structure causes the axial phase velocity of electromagnetic radiation in the structure to be substantially matched with the beam velocity. Energy in the beam is thus transferred to the electromagnetic signal which is then directed from the tube. As contrasted with plasma wave tubes, the process of reducing the electromagnetic phase velocity requires a structural periodicity, e.g., a rippled-wall, in the axial direction of the slow-wave structure. Such structures typically require lower operating gas pressures than are used in plasma wave tubes because they require lower operating plasma densities.

Figure 5A:
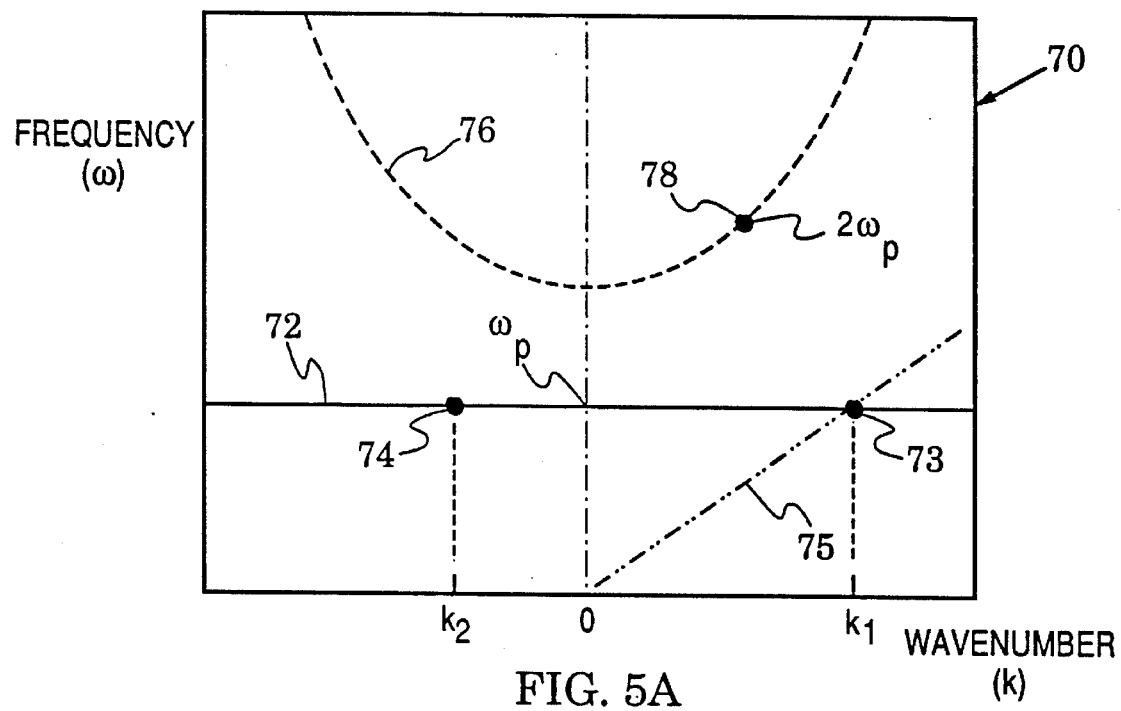
FIG. 5A is a frequency-wavenumber diagram illustrating a first unprimed operation mode of the embodiment of FIG. 1.

To better understand the operational use of the waveguide system 44, attention is now directed to the frequency-wavenumber diagram 70 of FIG. 5A. The radiation, generation, and selection processes in the plasma wave tube 20 are governed by energy and momentum conservation rules. The effect of the electron beam 24 upon the waveguide plasma, in accordance with these rules, is illustrated in the diagram 70.

EPW dispersion is expressed by the relationship $\omega_1^2 = \omega_p^2 + 3k_1^2 v_{th}^2$, where $v_{th}$ is the electron thermal speed, $\omega_p$ is the plasma frequency, and $\omega_1$ and $k_1$ are the frequency and wavenumber for the EPW's. This expression relating $\omega_1$ and $k_1$ is represented by the curve 72 which appears to be a straight line because of the highly magnified scale of FIG. 5A. The dispersion of the electron beam 24 is represented in FIG. 5A by a straight line 75 with slope=$v_b$=$v_{ph}$, where $v_b$ is the beam velocity and $v_{ph}$ is the beam's phase velocity.

The EPW's temporal and spatial growth rates can be calculated using well-known beam-plasma physics. The frequency and wavenumber at which the forward EPWs will grow are represented, for example, by the intersection 73 of the EPW dispersion curve 72 and the electron beam dispersion line 75. As an intense electron beam excites these forward EPWs, these plasma waves can, in turn, generate backscattered EPWs 32 as shown schematically in FIG. 1 and represented by the dot 74 in FIG. 5A. This generation proceeds via several known processes, e.g., parametric decay and Rayleigh scattering.

The counterpropagating EPWs 30, 32 interact to generate electromagnetic radiation when energy and momentum conservation rules for the process are satisfied. These rules are $\omega_1+\omega_2=\omega_{em}$, and $k_1+k_2=k_{em}$, where $\omega_1$, $k_1$ and $\omega_2$, $k_2$, are the frequency and wavenumber vectors of the EPWs 30, 32, respectively, and $\omega_{em}$ and $k_{em}$ are the respective frequency and wavenumber vectors of the excited electromagnetic wave $k_1$ and $\omega_p$ are shown in FIG. 5A.

The constraints are that the EPWs 30, 32 satisfy $\omega_{1,2}^2 = \omega_p^2 + 3k_{1,2}^2 v_{th}^2$, and that the electromagnetic wave satisfies $\omega_{em}^2 = \omega_c^2 + \omega_p^2 + k_{em}^2 c^2$, where $\omega_c$ is the cutoff frequency for the excited electromagnetic mode within the waveguide 26, and c is the speed of light in a vacuum. The latter expression is indicated by curve 76 in FIG. 5A.

Applying the conservation rules and observing that $\omega_1 \sim \omega_2 \sim \omega_p$, leads to $\omega_{em} \sim 2\omega_p$ as indicated in FIG. 5A by the dot 78. Thus, energy contained in the EPW's electrostatic fields transfers to an electromagnetic wave and, since the radiation frequency is much higher that the plasma frequency ($\omega_{em} \sim 2\omega_p > \omega_p$), the radiation propagates through the plasma with little loss.

If the RF reference frequency $\omega_o$, injected into the waveguide 26, is approximately equal to $\omega_1$, a preferred EPW mode near $\omega_1$ is excited and the excited EPW spectrum will have most of its power concentrated at $\omega_1$. If the plasma density is different elsewhere in the beam-plasma interaction region of the waveguide 26 (as is probable for high-power plasma wave tubes), a different dispersion curve 82 will control the EPW propagation as shown in the frequency-wavenumber graph 80 of FIG. 5B (dispersion curves 72 and 82 have respective plasma frequencies $\omega_{p1}$ and $\omega_{p2}$).

Figure 5B:
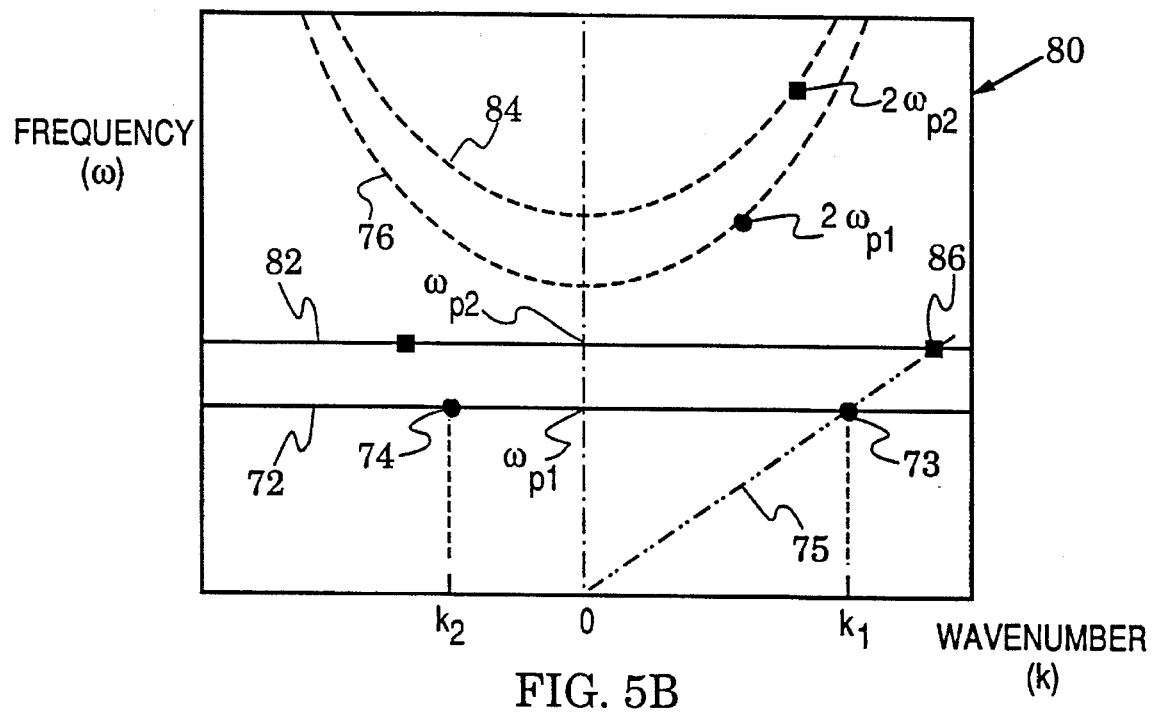
FIG. 5B is another frequency-wavenumber diagram illustrating a second operation mode of the embodiment of FIG. 1 when primed by an RF input signal.

FIG. 5B is similar to FIG. 5A with like elements indicated by like reference numbers. The electromagnetic wave curve 76 is also shifted to the curve 84 because of the different value of $\omega_p$. The squares 86 in FIG. 5B indicate EPWs selected by an unmodulated electron beam 24 (the electromagnetic wave curves 76 and 84 have respective doubled plasma frequencies $2\omega_{p1}$ and $2\omega_{p2}$. EPW amplitudes at frequencies other than $\omega_o$, e.g., at 86, will be reduced when the electron beam 24 is prebunched at $\omega_o$. Consequently, the bandwidth of the radiated signal (34 in FIG. 1) will be reduced. In addition, it is theorized that beam-to-radiation efficiency will be increased.

In summary, in single-beam plasma wave tubes, the injected electron beam 24 excites forward EPWs which, in turn, excite backscattered EPWs. These EPWs interact to generate the electromagnetic output signal 34 of FIG. 1. The process represented in FIG. 5B indicates that an RF reference signal (43 in FIG. 2) injected into the plasma of the tube 20 can enhance production of desired EPWs and repress production of other EPWs so that the output signal 34 is generated to be twice the reference signal. That is, the input signal 34 is used to prime the oscillation process of the interacting EPW's to control the output tube frequency. Over an appropriate portion of the dynamic range of the tube, the tube's output signal 34 will be an amplified and frequency doubled version of the reference. Thus, the plasma wave tube 20 of FIG. 1 can be operated as a primed oscillator or as an amplifier.

Attention is now redirected to the injection of the electron beam 24 into the waveguide 28 as illustrated in FIG. 1. Without any transport mechanism, the electron beam 24 would rapidly expand radially due to electrostatic space-charge forces. In conventional microwave tubes, large magnetic structures and supporting power supplies are used to develop axial magnetic fields that transport the electron beam through structures that couple electromagnetic energy from the beam. Externally applied magnetic fields are not required in the plasma wave tube 20 because the space-charge forces are canceled by the plasma produced in the background gas 28 by beam ionization. When the beam self-generated azimuthal magnetic field pressure exceeds the beam thermal pressure, the beams's self-magnetic field causes the electron beam 24 to compress radially in a process known as the "Bennet pinch."

Electron guns suitable for practicing the invention must be capable of generating high beam currents, e.g., >2 amperes, with high beam voltages, e.g., >10 kV. In addition, the electron guns preferably can operate in the environment of an ionizable gas and over a range of gas pressures. Electron guns in accordance with these requirements include those described in U.S. Pat. No. 3,831,052 assigned to Hughes Aircraft Company, the assignee of the present invention, and in copending U.S. patent application Ser. No. 08/242,569, entitled "High-Current, Low-Pressure, Plasma-Cathode Electron Gun", filed May 14, 1994 and also assigned to Hughes Aircraft Company. The plasma wave tube 20, as illustrated in FIG. 1, includes an electron gun 22 in accordance with this application.

In particular, the gun 22 has a hollow cathode 100 filled with an ionizable gas 102, i.e., it is a plasma-cathode electron gun. The gas 102 is ionized to a plasma by a discharge voltage placed across it and the electron beam 24 is extracted from the resultant plasma with a beam voltage impressed across an accelerator structure 104. A plasma face is defined by a partially transparent electrode in the form of a mesh 105 that is coupled to a discharge anode 106. The partially transparent electrode 105 provides isolation between the plasma discharge process and the electron beam extraction process.

Thermionic electron emission from a thermionic emitter 107, e.g., a barium oxide, tungsten or lanthanum hexaboride filament or wafer, facilitates plasma formation. The efficiency of the ionization is enhanced by directing a first portion of the plasma electrons to flow through a magnetic field that is established by annular magnets 108 to oppose that flow.

The accelerator 104 is positioned adjacent to an outlet defined in the wall of the hollow cathode 100. The accelerator 104 includes the discharge anode 106 and spaced therefrom, a beton anode 110. The discharge anode 106 and beam anode 110 each define a plurality of apertures 112 and the spacing between the anodes defines an acceleration region 114. The anodes are supported on a high-voltage insulating bushing 116 formed, for example, of ceramic. The partially transparent electrode 105 is physically and electrically coupled to the discharge anode 106 on its side facing the interior of the cathode 100.

In operation, a filament supply (not shown) heats the thermionic emitter 107. A discharge supply 120 supplies a pulse across the emitter 107 and the discharge anode 106 which ionizes the gas 102 to form a plasma. A portion of the plasma electrons are accelerated across the acceleration region 114 by a beam supply voltage 122 placed across the anodes 106, 110.

The ionization efficiency is enhanced by directing another portion of the plasma electrons through the magnetic field of the magnets 108. This is accomplished by completing a current path between the cathode 100 and the discharge anode 106 with a voltage differential device in the form of a resistor 126.

As stated above, the mesh 105 defines the plane of the electron source for the accelerator 104, i.e., the plasma face. This allows the gun 22 to operate with reasonably arbitrary voltage and current combinations (e.g., voltages in the range of 20–120 kV and currents in the range of 1–120 amperes) because the mesh defines and stabilizes the location of an acceleration plane. The electrons thus enter the acceleration region 114 from the same location, i.e, the plane of the mesh 105, independent of the system voltage and current. This means the designed beam optics remain stable which reduces tendencies for high-voltage arcing.

In addition, the mesh 105 stabilizes the electron extraction from the plasma face by providing a measure of isolation between the plasma discharge process and the electron beam extraction process. Without the mesh 105, interaction between the beam voltage and discharge voltage provides a potential for unstable operation.

An exemplary electron gun has been constructed in which the grids 106, 110 were formed of molybdenum with apertures having a 0.46 centimeter diameter. The grids 106, 110 were spaced approximately one centimeter apart and supported on the ceramic bushing 116. The mesh 105 had openings of approximately 0.5 mm diameter and was formed from molybdenum.

An exemplary realization of the waveguide injection system 44 has been tested and found to have a return loss at the port 54 (see FIG. 2) of 30 dB at the designed frequency and an insertion loss of less than 1 dB over a 25% bandwidth.

Tests with free running plasma wave oscillators indicates that plasma wave tubes in accordance with the invention are suitable for production of output powers ranging from a few watts at low beam current and voltage to >10 kW for beam currents and voltages in the range of 85 amperes and 50 kV.

Figure 6:
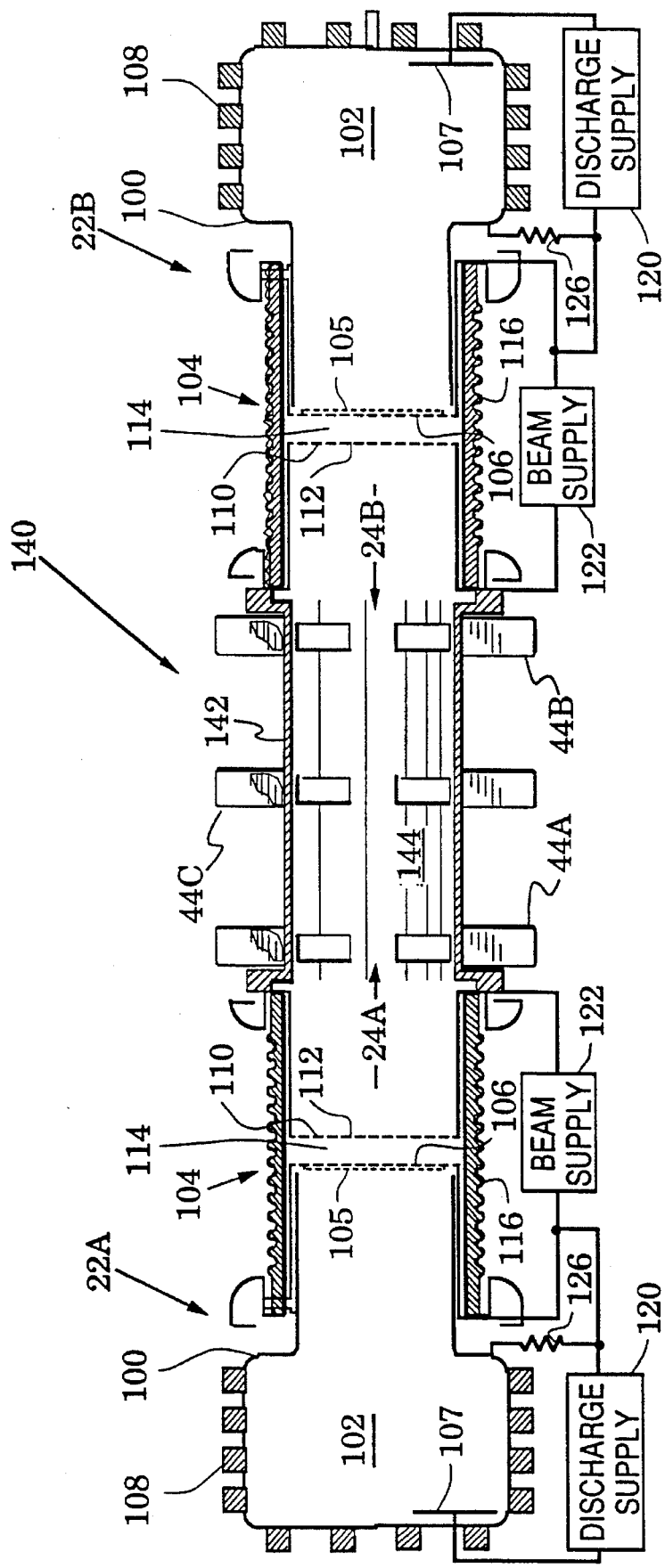
FIG. 6 illustrates another preferred plasma wave tube embodiment.

The teachings of the invention can be extended to plasma wave tubes that employ multiple electron beams injected into a plasma for excitation of EPWs and consequent production of RF energy. For example, FIG. 6 illustrates a plasma wave tube 140 in which two electron guns 22A, 22B inject oppositely directed electron beams 24A, 24B into a circular waveguide 142 filled with an ionizable gas 144. The electron guns 22A and 22B are similar to the electron gun 22 of FIG. 1 with like elements indicated by like reference numbers. Waveguide injection systems 44A, 44B are positioned at each end of the waveguide 142 so that RF input signals can be injected for prebunching of the electron beams 24A, 24B. A waveguide collection system 44C, similar to the injection systems 44A, 44B, is positioned along the mid-region of the waveguide 26 for extraction of the output RF signal produced by the resulting EPW interaction. The output power is thus delivered to a port of the system 44C similar to the port 54 shown in FIG. 2.

Figure 7:
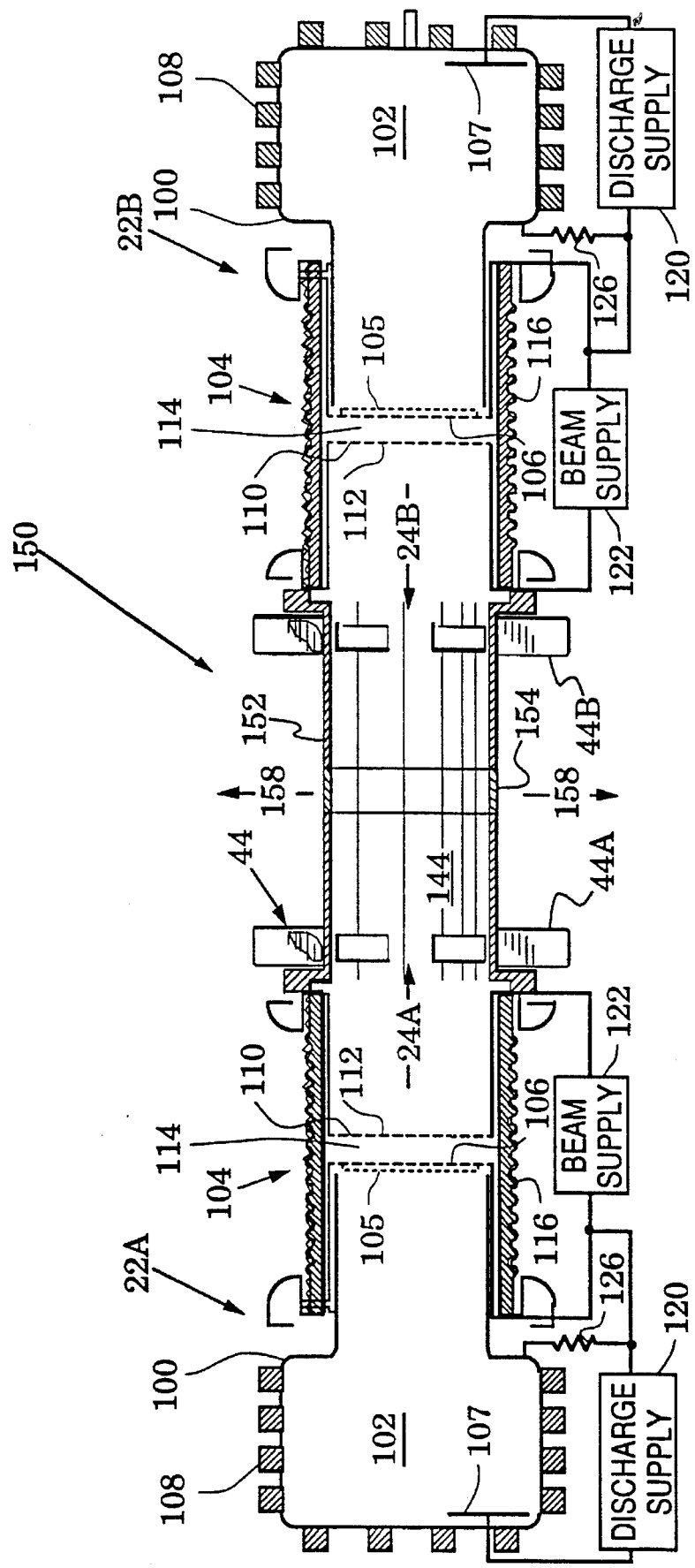
FIG. 7 illustrates another preferred plasma wave tube embodiment.

FIG. 7 illustrates another plasma wave tube embodiment 150. This embodiment is similar to the embodiment 140 of FIG. 6 with like elements indicated by like reference numbers. However, the waveguide 142 and the output waveguide system 44C are replaced with a waveguide 152 having a centrally positioned section 154 made of an RF transparent material, e.g., ceramic, glass. In this embodiment, the output RF power radiates radially through the waveguide section 154, as indicated by arrows 158.

While several illustrative embodiments of the invention have been shown and described, numerous variations and alternate embodiments will occur to those skilled in the art. Such variations and alternate embodiments are contemplated, and can be made without departing from the spirit and scope of the invention as defined in the appended claims.

We claim:

1. A plasma wave tube comprising:

a cylindrical waveguide member having a longitudinal axis and configured to contain an ionizable gas;

first and second electron guns mounted on said cylindrical waveguide member and configured to respectively inject first and second electron beams through said ionizable gas for ionization of said ionizable gas to a plasma and generation in said plasma of electron plasma waves;

first and second waveguide injection systems respectively joined to said cylindrical waveguide member and configured for injection of corresponding RF input signals into said cylindrical waveguide member for prebunching of said first and second electron beam and exciting of a desired set of electron plasma waves, said respective RF input signals having a corresponding input frequency, the corresponding input frequency of said respective RF input signals being the same; and a waveguide collection system joined to said cylindrical waveguide member for receiving an RF output signal which is developed by interaction of said desired set of electron plasma waves, said RF output signal having a frequency which is substantially twice said input frequency;

wherein each of said first and second waveguide injection systems includes:

a respective plurality of rectangular waveguides which are each joined radially with said cylindrical waveguide member for communication with said cylindrical waveguide member, said respective rectangular waveguides arranged with substantially equal circumferential spacing about said waveguide member;

a respective input waveguide member joined to corresponding said rectangular waveguides for communication with said corresponding rectangular waveguides;

a respective port defined in said input waveguide member for reception of one of said RF input signals; and wide and narrow sides respectively defined in each of said rectangular waveguides and said input waveguide member with said respective wide sides arranged orthogonal with respect to said axis.

2. The plasma wave tube of claim 1, wherein said cylindrical waveguide member includes first and second inward directed, annular, reflection-control rings which are each positioned with a respective axial spacing from a corresponding one of said first and second waveguide injection systems.

3. The plasma wave tube of claim 2, wherein said respective axial spacing is an integral number of half-wavelengths of said RF input signals.

4. A plasma wave tube comprising:

a cylindrical waveguide member having a longitudinal axis and configured to contain an ionizable gas;

an electron gun mounted on said cylindrical waveguide member and configured to inject an electron beam through said ionizable gas for ionization of said ionizable gas to a plasma and generation in said plasma of electron plasma waves;

a waveguide injection system joined to said cylindrical waveguide member and configured for injection of an RF input signal into said cylindrical waveguide member for prebunching of said electron beam and exciting of a desired set of electron plasma waves, said RF input signal having an input frequency; and an exit end defined in said cylindrical waveguide member for delivery of an RF output signal which is developed by interaction of said desired set of electron plasma waves, said RF output signal having a frequency which is substantially twice said input frequency;

wherein said waveguide injection systems includes:

a respective plurality of rectangular waveguides which are each joined radially with said cylindrical waveguide member for communication with said waveguide member, said respective rectangular waveguides arranged with substantially equal circumferential spacing about said waveguide member;

a respective input waveguide member joined to said corresponding rectangular waveguides for communication with said corresponding rectangular waveguides;

a respective port defined in said input waveguide member for reception of said RF input signal; and wide and narrow sides respectively defined in each of said rectangular waveguides and said input waveguide member with said respective wide sides arranged orthogonal with respect to said axis.

5. The plasma wave tube of claim 4, further including an RF-transparent radome coupled to said exit end.

6. The plasma wave tube of claim 4, wherein said cylindrical waveguide member includes an inward directed, annular, reflection-control ring which is positioned with an axial spacing from said respective rectangular waveguides.

7. The plasma wave tube of claim 6, wherein said axial spacing is an integral number of half-wavelengths of said RF input signal.

8. A plasma wave tube comprising:

a cylindrical waveguide member having a longitudinal axis and configured to contain an ionizable gas;

first and second electron guns mounted on said cylindrical waveguide member and configured to respectively inject first and second electron beams through said ionizable gas for ionization of said ionizable gas to a plasma and generation in said plasma of electron plasma waves;

first and second waveguide injection systems respectively joined to said cylindrical waveguide member and configured for injection of corresponding RF input signals into said cylindrical waveguide member for prebunching of said first and second electron beams and exciting of a desired set of electron plasma waves, said respective RF input signals having a corresponding input frequency, the corresponding input frequency of said respective RF input signals being the same; and an RF transparent portion defined in said cylindrical waveguide member for radiation of an RF output signal which is developed by interaction of said desired set of electron plasma waves, said RF output signal having a frequency which is substantially twice said input frequency;

wherein each of said first and second waveguide injection systems includes:

a respective plurality of rectangular waveguides which are each joined radially with said cylindrical waveguide member for communication with said cylindrical waveguide member, said respective rectangular waveguides arranged with substantially equal circumferential spacing about said waveguide member;

a respective input waveguide member joined to corresponding said rectangular waveguides for communication with said corresponding rectangular waveguides;

a respective port defined in said input waveguide member for reception of one of said RF input signals; and wide and narrow sides respectively defined in each of said rectangular waveguides and said input waveguide member with said respective wide sides arranged orthogonal with respect to said axis.

9. The plasma wave tube of claim 8, wherein said cylindrical waveguide member includes first and second inward directed, annular, reflection-control rings which are each positioned with a respective axial spacing from a corresponding one of said first and second waveguide injection systems.

10. The plasma wave tube of claim 9, wherein said respective axial spacing is an integral number of half-wavelengths of said RF input signals.

* * * * *